United States Patent

Kimura et al.

(10) Patent No.: US 6,640,436 B1
(45) Date of Patent: Nov. 4, 2003

(54) METHOD OF FABRICATING A COATED METALLIC WIRE, METHOD OF REMOVING INSULATION FROM THE COATED METALLIC WIRE AND METHOD OF FABRICATING A SEMICONDUCTOR DEVICE WITH THE WIRE

(75) Inventors: Naoto Kimura, Kumamoto (JP); Takahiro Ito, Kumamoto (JP)

(73) Assignee: NEC Electronics Corporation, Kawasaki (JP)

( * ) Notice: Subject to any disclaimer, the term of this patent is extended or adjusted under 35 U.S.C. 154(b) by 189 days.

(21) Appl. No.: 09/664,717

(22) Filed: Sep. 19, 2000

Related U.S. Application Data

(62) Division of application No. 09/173,742, filed on Oct. 16, 1998, now Pat. No. 6,239,376.

(30) Foreign Application Priority Data

Oct. 16, 1997 (JP) .............................................. 9-283861

(51) Int. Cl.[7] .............................................. H01R 43/04
(52) U.S. Cl. .............................. 29/867; 29/825; 29/857; 29/864; 219/121.69; 219/121.85
(58) Field of Search ........................ 29/859, 864, 867, 29/868, 872, 564.4, 33.52, 749, 825, 857; 174/92, 102, 36, 110 R; 219/56.22, 121.84, 121.69

(56) References Cited

U.S. PATENT DOCUMENTS

| 3,930,104 A | 12/1975 | MacKenzie, Jr. et al. |
|---|---|---|
| 3,941,866 A | 3/1976 | Ingraham |
| 4,085,162 A | 4/1978 | MacKenzie, Jr. et al. |
| 4,105,825 A | 8/1978 | Heath et al. |
| 4,107,370 A | 8/1978 | Ingraham |
| 4,182,382 A | 1/1980 | Ingraham |
| 4,200,973 A | 5/1980 | Farkas |
| 4,237,186 A | 12/1980 | Ingraham |
| 4,361,723 A | 11/1982 | Hvizd, Jr. et al. |
| 4,431,982 A | 2/1984 | Monroe et al. |
| 4,607,154 A | 8/1986 | Mills |
| 4,671,848 A | * 6/1987 | Miller et al. ................ 156/643 |
| 4,970,488 A | 11/1990 | Horike et al. |
| 4,998,002 A | * 3/1991 | Okikawa et al. ......... 219/56.22 |
| 5,074,313 A | 12/1991 | Dahl et al. |
| 5,176,310 A | * 1/1993 | Akiyama et al. ........... 228/179 |
| 5,935,465 A | * 8/1999 | Cardineau et al. ...... 219/121.69 |
| 6,218,728 B1 | * 4/2001 | Kimura ...................... 257/693 |
| 6,374,488 B1 | * 4/2002 | Mclean et al. ................ 29/867 |

FOREIGN PATENT DOCUMENTS

| EP | 000355955 | * 12/1989 |
|---|---|---|
| JP | 2-17813 | * 1/1990 |
| JP | 2-266541 | 10/1990 |
| JP | 5-343461 | 12/1993 |
| JP | 8-118051 | * 5/1996 |
| JP | 9-55395 | 2/1997 |

* cited by examiner

Primary Examiner—Carl J. Arbes
Assistant Examiner—Minh Trinh
(74) Attorney, Agent, or Firm—McGinn & Gibb, PLLC

(57) ABSTRACT

A method for fabricating a semiconductor device includes removing a predetermined part of an insulative layer of a coated fine metallic wire by irradiating the predetermined part with a laser light and connecting the predetermined part of the fine metallic wire to one of the semiconductor device and a package of the semiconductor device. The insulative layer contains a substance that absorbs the laser light at a predetermined lasing wavelength.

12 Claims, 3 Drawing Sheets

METHOD OF FABRICATING A COATED METALLIC WIRE, METHOD OF REMOVING INSULATION FROM THE COATED METALLIC WIRE AND METHOD OF FABRICATING A SEMICONDUCTOR DEVICE WITH THE WIRE

This application is a divisional of application Ser. No. 09/173,742 filed Oct. 16, 1998 now U.S. Pat. No. 6,239,376 issued May 29, 2001.

FIELD OF THE INVENTION

The invention relates to a coated fine metallic wire, and especially to a coated fine metallic wire to be used as a bonding wire in a semiconductor device and a method for fabricating a semiconductor device using the same.

BACKGROUND OF THE INVENTION

A conventional coated fine metallic wire used as a bonding wire in a semiconductor device is composed of a fine metallic wire and an insulative layer formed therearound, and its exterior view is the same as that of a coated fine metallic wire according to the invention shown in FIG. 1.

As an example of the aforementioned coated fine metallic wire, that insulated by heat resisting epoxy resin is described in Japanese patent Kokai 7-268278. Moreover, in the above mentioned reference, polyurethane resin, nylon resin, polyimide resin, resin of fluorine series, polyethylene resin, poly vinyl chloride resin, enamel as varnish, polyester resin and heat resisting polyurethane resin are described as known material used for the same purpose.

Among the coated fine metallic wires covered with aforementioned known material, that covered with polyester is unsuited for bonding and failure in bonding is apprehended, for rigidity of polyester is too high. Heat resisting properties of polyester resin, polyimide resin, nylon resin and resin of fluorine series are high. However, each of these is not resolved, but carbonized by heating temperature at the time of bonding, especially in case that an end portion of the coated fine metallic wire is melted and formed into a metallic ball. Accordingly, a carbonized matter stuck to the coated wire or the metallic ball is caught by a capillary, and disturbs supply of the wire and bonding between the metallic ball and an electrode terminal. On the other hand, in order to bond the coated wire with a lead with high reliability, it is necessary to thermally remove the insulative layer at a bonding part of the coated wire on the side of the lead by means of discharge process, but a carbonized matter remains on the surface of the metallic wire, hence subsequent bonding cannot be carried out securing high reliability.

In heat resisting epoxy resin used as material of the insulative layer, uplift of heat resisting property, avoidance of occurrence of carbonized matter and improvement of reliability of bonding are intended. However, even in case of the coated fine metallic wire with the insulative layer formed of heat resisting epoxy resin, removal of the insulative layer is carried out by means of discharge process, so that it is difficult to remove the insulative layer without melting the fine metallic wire and securing stability.

SUMMARY OF THE INVENTION

Accordingly, it is an object of the invention to provide a coated fine metallic wire, in which an insulative layer can be certainly removed without melting a fine metallic wire and securing stability.

It is a further object of the invention to provide a method for fabricating a semiconductor device using a coated fine metallic wire, in which an insulative layer can be certainly removed without melting a fine metallic wire and securing high ntability.

According to the first feature of the invention, a covered fine metallic wire comprises:

a fine metallic wire, and an insulative layer, which is formed around the fine metallic wire and absorbs a laser light of a predetermined laising wavelength with high efficiency.

According to the second feature of the invention, a method for fabricating a semiconductor device comprises:

removing a predetermined part of an insulative layer of a coated fine metallic wire, which contains substance absorbing a laser light of a predetermined lasing wavelength with high efficiency, by irradiating the predetermined part of the insulative layer with the laser light, and connecting a fine metallic wire at the predetermined part with a semiconductor device or its package.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
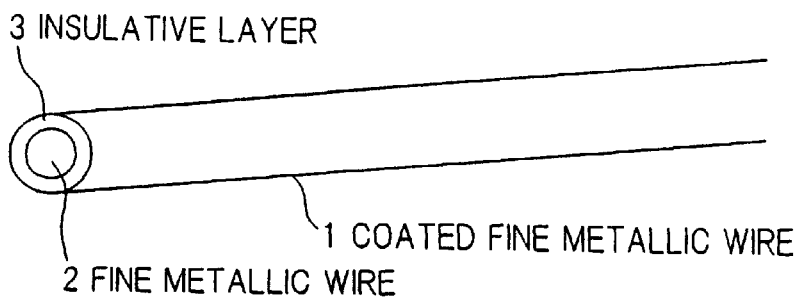
FIG. 1 shows a perspective view for schematically showing an exterior view of a coated fine metallic wire used as a bonding wire in a semiconductor device according to the invention.

Next, the embodiments of the invention will be explained in detail referring to the drawings. FIG. 1 shows a perspective view of a coated fine metallic wire used as a bonding wire in a semiconductor device schematically as the first preferred embodiment of the invention.

The coated fine metallic wire 1 according to the invention is produced by coating a fine metallic wire 2 formed of Au with an insulative layer 3 formed of nylon resin containing about 15 weight percent of iron black pigment.

Figure 2:
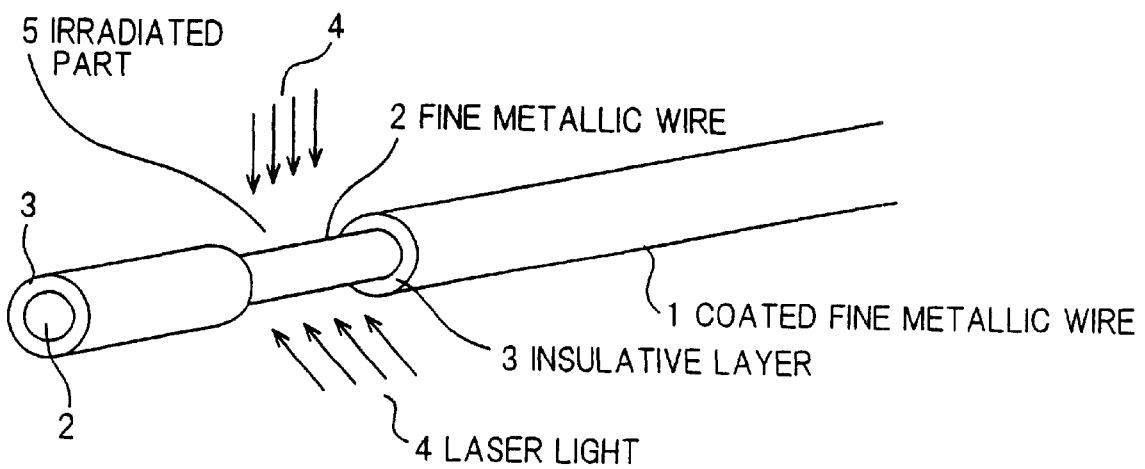
FIG. 2 shows a perspective view for schematically showing the state that a part of an insulative layer of a coated fine metallic wire is removed.

FIG. 2 shows a perspective view for schematically showing the coated fine metallic wire 1, the insulative layer 3 of which is removed by irradiation of a laser light 4. The insulative layer 3 at the irradiated part 5 is removed by irradiation of the laser light 4 and the fine metallic wire 2 is exposed. As mentioned in the above, since the insulative layer 3 of the coated fine metallic wire 1 according to the invention is formed of nylon resin containing about 15 weight percent of iron plack pigment, the insulative layer 3 absorbs the laser light 4 with high efficiency, and only the insulative layer 3 at the irradiated part 5 is perfectly removed without hurting the fine metallic wire 2.

Next, a method for fabricating a semiconductor device comprising the coated fine metallic wire 1 will be explained referring to the drawings as the second preferred embodiment of the invention.

Figure 3:
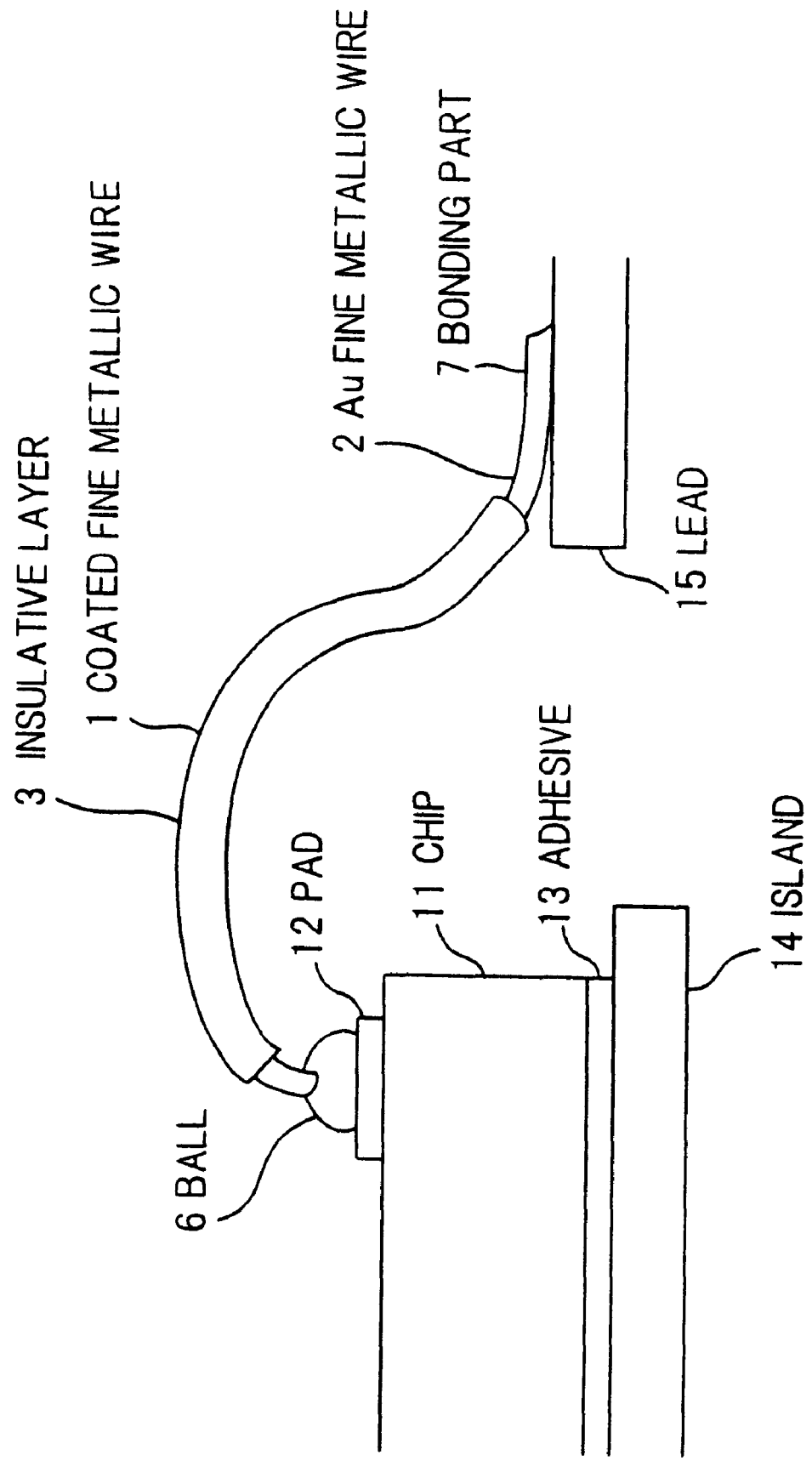
FIG. 3 shows a cross-sectional view for schematically showing the state that a fine metallic wire formed of Au is used as a bonding wire in a semiconductor device.

FIG. 3 shows a cross-sectional view for schematically showing the state of a coated fine metallic wire used as a bonding wire in a semiconductor device. After an end of the coated fine metallic wire 1 is bonded with a pad 12 of a chip 11, which is adhered to an island 14 of a lead frame (or a package) by adhesive 13 such as silver paste, another end thereof is bonded with a lead 15.

Explaining concretely, discharge process is applied to a part near an end of the coated fine metallic wire 1 on the side of the pad 12, the insulative layer 3 is removed, and an Au wire 2 is melted to form a ball 6, which is bonded with the pad 12 by thermal compression bonding. On the other hand, near another end of the coated fine metallic wire 1 on the side of a lead 15, the insulative layer 3 at a bonding part 7 is irradiated by a laser light 4 so that the insulative layer 3 corresponding thereto is perfectly removed. Thereafter, the bonding part 7 of the covered fine metallic wire 1 is bonded with the lead 15 by thermal compression bonding.

Figure 4:
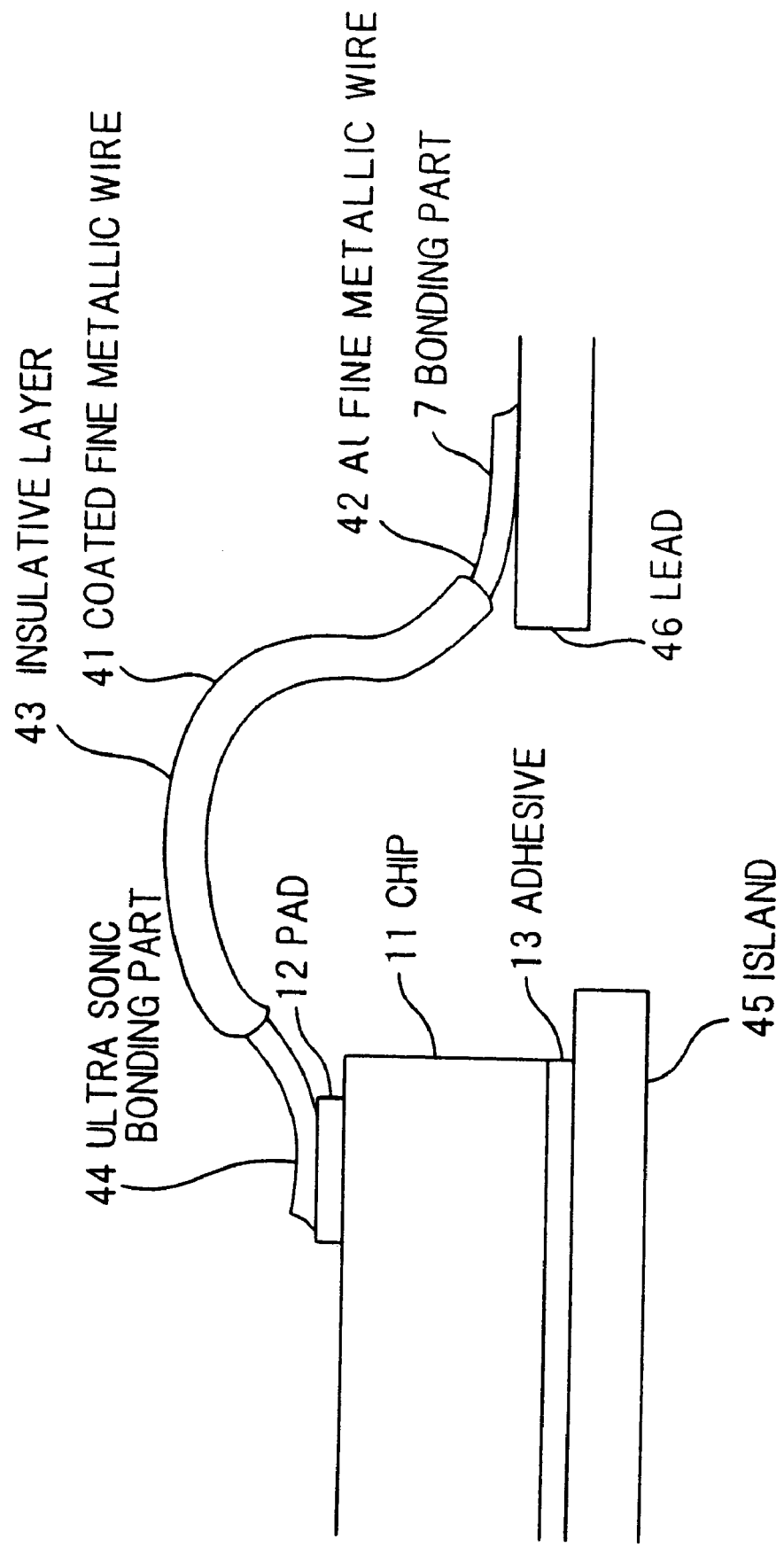
FIG. 4 shows a cross-sectional view for schematically showing the state that fine metallic wire formed of Al is used as a bonding wire in a semiconductor device.

FIG. 4 shows a cross-sectional view for schematically showing the state of bonding in the semiconductor device for case that a fine metallic wire 42 of the coated fine metallic wire 41 is formed of Al. In this case, since it is impossible to form the coated insulative wire 41 into a ball by discharge process on the side of the pad 12, the insulative layer 43 is irradiated by the laser light 4 at the irradiated part 5 corresponding to a ultra sonic bonding part 44 so that the insulative layer 43 thereon is perfectly removed. Thereafter, the ultra sonic bonding part 44 of the coated fine metallic wire 41 is bonded with the pad 12 by ultra sonic bonding process. Since bonding on the side of the lead 46 is the same as that shown in FIG. 3, an explanation thereon will be omitted.

As mentioned in the above, according to the method for fabricating the semiconductor device according to the embodiment of the invention, since the insulative layer of the coated fine metallic wire can be removed without hurting the fine metallic wire by means of laser irradiation, more stable bonding becomes possible.

Especially, in case that the insulative layer contains pigment or dye of a suitable percentage, since the insulative layer aborbs the laser light with high efficiency, the effect is noticeable.

Moreover, in case that an ultraviolet laser is used, the laser light absorption is concentrated in the vicinity of the surface of the insulative layer, the effect is still more noticeable.

Furthermore, the kinds and the percentage of content of carbonic impalpable powder, pigment or dye contained in the insulative layer can be suitably selected in accordance with the basic material of the insulative layer and the condition of coating (such as thickness of the insulative layer). The lasing wavelength and the output power of the laser light for removing the insulative layer can be suitably selected in consideration of basic material of the insualtive layer, the condition of coating, the kinds and percentage of content of carbonic impalpable powder, pigment and dye.

According to the coated fine metallic wire for bonding in the semiconductor device according to the invention, since its insulative layer contains pigment or dye, the laser light is absorbed by the insulative layer with high efficiency, only the insulative layer at the irradiated part can be removed, and therefore stable bonding can be realized.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for fabricating semiconductor device comprising:

removing a predetermined part of an insulative layer of a coated fine metallic wire, by irradiating said predetermined part of said insulative layer with a laser light, said insulative layer containing a substance absorbing said laser light of a predetermined lasing wavelength; and connecting said fine metallic wire at said predetermined part to one of said semiconductor device and a package of said semiconductor device.

2. The method for fabricating a semiconductor device according to claim 1, wherein said laser light comprises ultraviolet laser light.

3. The method of claim 1, wherein said fine metallic wire comprises gold.

4. The method of claim 1, wherein said fine metallic wire comprises aluminum.

5. The method of claim 1, wherein said insulative layer comprises nylon resin containing about 15 weight percent of iron black pigment.

6. The method of claim 1, wherein said insulative layer comprises more than 3 but no more than 35 weight percent of pigment.

7. The method of claim 1, wherein said insulative layer comprises more than 3 but no more than 35 weight percent of dye.

8. The method of claim 7, wherein said dye comprises one of azo dye, anthraquinone dye, indigoid dye, diphenylmetane dye, tryphenylmetane dye, xanthene dye, acridine dye, azine dye, oxazine dye, thiazine dye, quinoline dye and phthalocyanine dye.

9. The method of claim 1, wherein said insulative layer comprises more than 3 but not more than 30 weight percent of carbonic impalpable powder.

10. The method of claim 9, wherein said carbonic impalpable powder comprises particles having a diameter of less than 1 $\mu$m.

11. The method of claim 1, wherein said insulative layer is formed directly on a surface of said fine metallic wire.

12. The method of claim 1, wherein the fine metallic wire is unharmed during said removing of said predetermined part of said insulative layer.

* * * * *